(12) United States Patent
Chang et al.

(10) Patent No.: US 10,128,420 B2
(45) Date of Patent: Nov. 13, 2018

(54) LED PACKAGE STRUCTURE AND CHIP-SCALE LIGHT EMITTING UNIT

(71) Applicant: LITE-ON TECHNOLOGY CORPORATION, Taipei (TW)

(72) Inventors: Yu-Yu Chang, Taipei (TW); Yu-Kang Lu, Taipei (TW); Yung-Chang Jen, New Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/857,777

(22) Filed: Dec. 29, 2017

(65) Prior Publication Data
US 2018/0190885 A1 Jul. 5, 2018

(30) Foreign Application Priority Data

Dec. 30, 2016 (CN) .......................... 2016 1 1259007
Nov. 20, 2017 (CN) .......................... 2017 1 1160545

(51) Int. Cl.
| | |
|---|---|
| *H01L 25/075* | (2006.01) |
| *H01L 33/58* | (2010.01) |
| *H01L 25/16* | (2006.01) |
| *H01L 33/62* | (2010.01) |
| *H01L 33/48* | (2010.01) |
| *H01L 33/50* | (2010.01) |
| *H01L 29/866* | (2006.01) |

(52) U.S. Cl.
CPC .......... *H01L 33/58* (2013.01); *H01L 25/0753* (2013.01); *H01L 25/167* (2013.01); *H01L 29/866* (2013.01); *H01L 33/483* (2013.01); *H01L 33/502* (2013.01); *H01L 33/505* (2013.01); *H01L 33/62* (2013.01)

(58) Field of Classification Search
CPC ... H01L 25/0753; H01L 25/167; H01L 33/58; H01L 33/62; H01L 33/502
See application file for complete search history.

(56) References Cited

U.S. PATENT DOCUMENTS

| | | | |
|---|---|---|---|
| 2012/0250350 A1* | 10/2012 | Kim .................. | G02F 1/133603 362/606 |
| 2013/0153947 A1* | 6/2013 | Lim ....................... | H01L 33/22 257/98 |
| 2015/0075611 A1* | 3/2015 | Inamura ............. | C09K 11/7731 136/257 |
| 2015/0236203 A1* | 8/2015 | Oh ....................... | G02B 6/0073 362/611 |

(Continued)

*Primary Examiner* — Douglas Menz
(74) *Attorney, Agent, or Firm* — Li & Cai Intellectual Property (USA) Office

(57) ABSTRACT

The present disclosure discloses an LED package structure and a chip-scale light emitting unit. The chip-scale light emitting unit includes an LED chip, a phosphor sheet, and at least one light guiding group. The phosphor sheet covers entirely a top surface of the LED chip. The phosphor sheet has a light emitting surface arranged away from the LED chip, and the light emitting surface has a central region and a ring-shaped region surrounding the central region. The light guiding group is disposed on the ring-shaped region and covers at least 60% of an area of the ring-shaped region of the phosphor sheet, and the central region is not covered by the light guiding group. The light guiding group includes a plurality of light guiding micro-structures.

20 Claims, 11 Drawing Sheets

(56) References Cited

U.S. PATENT DOCUMENTS

| | | | |
|---|---|---|---|
| 2016/0097495 A1* | 4/2016 | Yamamoto | G02B 6/0073 |
| | | | 349/65 |
| 2016/0284934 A1* | 9/2016 | Ko | H01L 33/025 |
| 2017/0009109 A1* | 1/2017 | Ito | F21V 9/30 |
| 2017/0358706 A1* | 12/2017 | Kim | H01L 33/0025 |

* cited by examiner

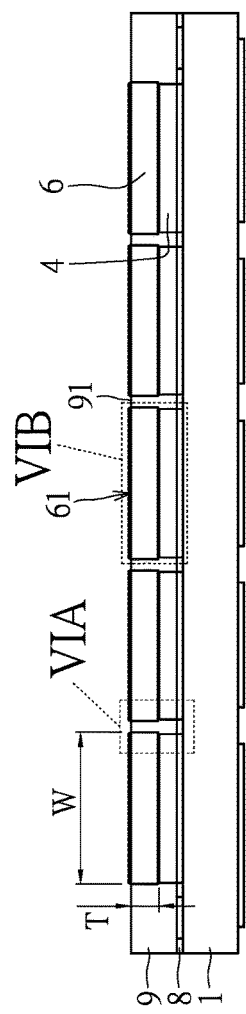
FIG. 5
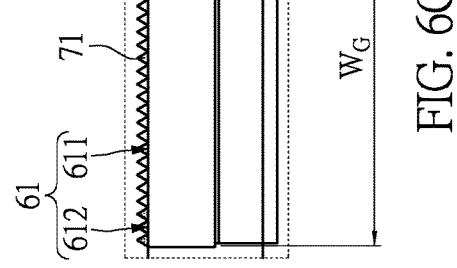
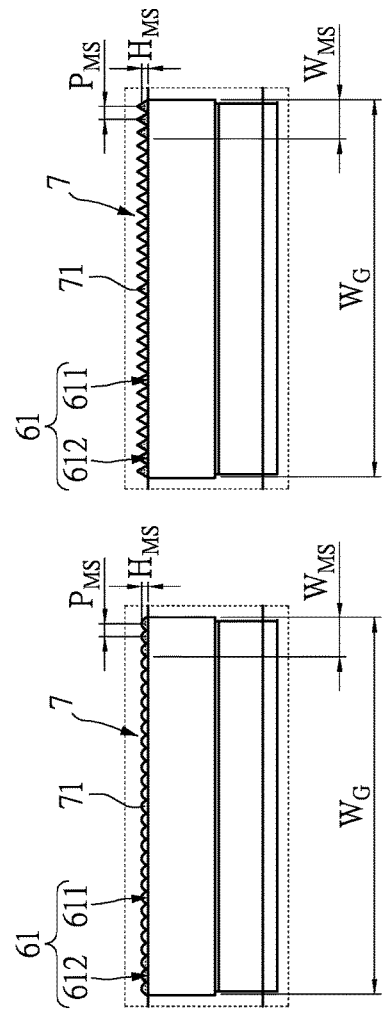
FIG. 6B
FIG. 6C
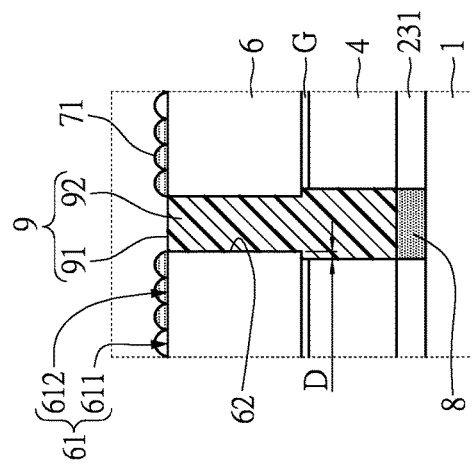
FIG. 6A

LED PACKAGE STRUCTURE AND CHIP-SCALE LIGHT EMITTING UNIT

BACKGROUND OF THE INVENTION

1. Field of the Invention

The present disclosure relates to a package structure; in particular, to an LED package structure and a chip-scale light emitting unit.

2. Description of Related Art

A conventional LED package structure includes an LED chip and a phosphor sheet disposed on the LED chip. The phenomenon of the yellow ring usually appears as the light emitted from the LED chip and passing through a center region of the phosphor sheet and a side region of the phosphor sheet. Specifically, the blue light emitted from the LED chip and passing through the side region of the phosphor sheet has a large incident angle with respect to the light emitting surface of the phosphor sheet. Furthermore, the difference of refractive index between the phosphor sheet and air is large, thereby resulting in the blue light being totally reflected from the light emitting surface of the phosphor sheet and causing the yellow ring problem.

SUMMARY OF THE INVENTION

The present disclosure provides an LED package structure and a chip-scale light emitting unit to solve the drawbacks associated with conventional LED package structures.

In the present disclosure, each of the LED package structures (or the chip-scale light emitting unit) adapts the light guiding group to be disposed on the ring-shaped region of the phosphor sheet, so that the total reflection occurring on the ring-shaped region can be reduced, thereby effectively improving the yellow ring problem for the LED package structure in the present disclosure.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

BRIEF DESCRIPTION OF THE DRAWINGS

FIG. 5 is a cross-sectional view taken along a cross-sectional line V-V of FIG. 1;

FIG. 6A is an enlarged view showing a portion VIA of FIG. 5;

FIG. 6B is an enlarged view showing a portion VIB of FIG. 5;

FIG. 6C is an enlarged view showing the portion VIB of FIG. 5 in another configuration;

DETAILED DESCRIPTION OF THE PREFERRED EMBODIMENTS

References are hereunder made to the detailed descriptions and appended drawings in connection with the present disclosure. However, the appended drawings are merely provided for exemplary purposes, and should not be construed as restricting the scope of the present disclosure.

First Embodiment

Figure 1:
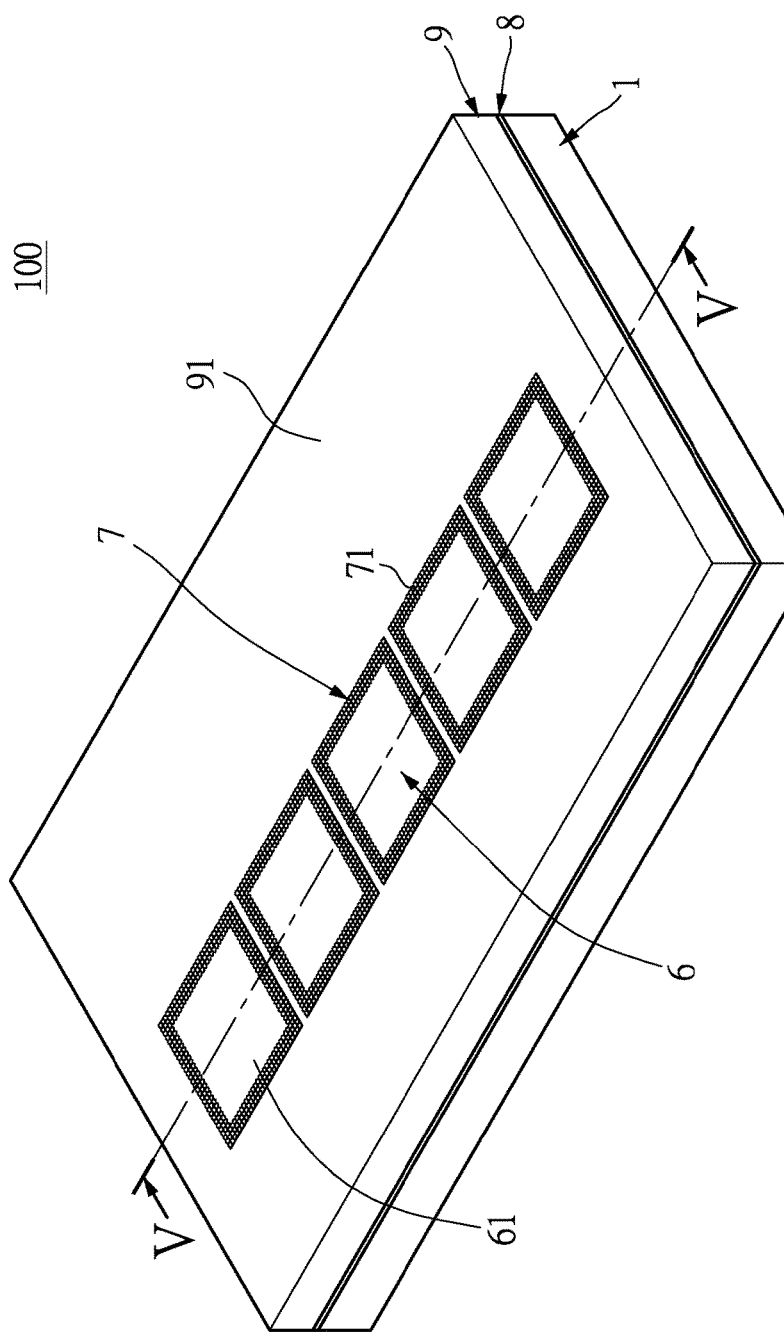
FIG. 1 is a perspective view showing an LED package structure according to a first embodiment of the present disclosure.
Figure 2:
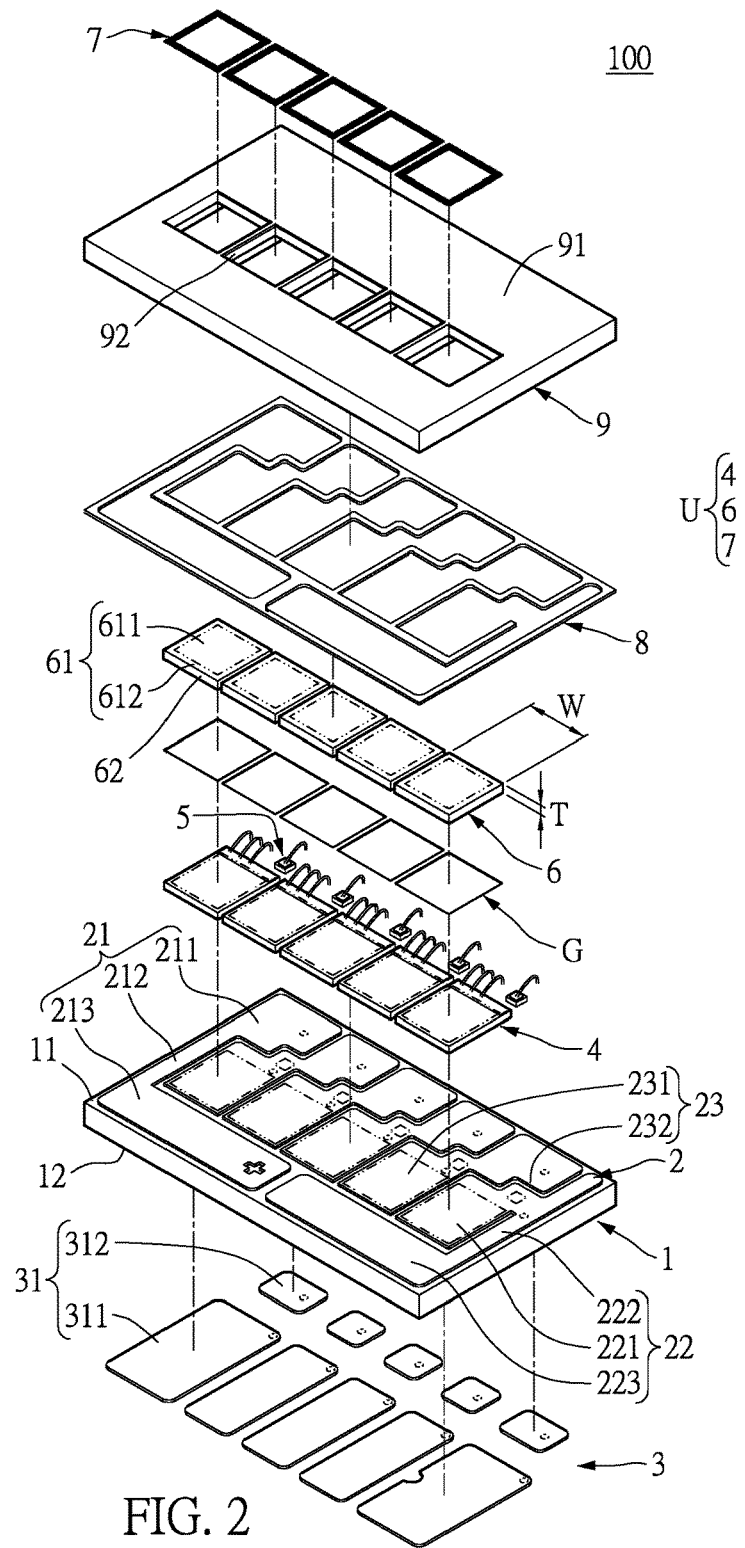
FIG. 2 is an exploded view of FIG. 1.
Figure 3:
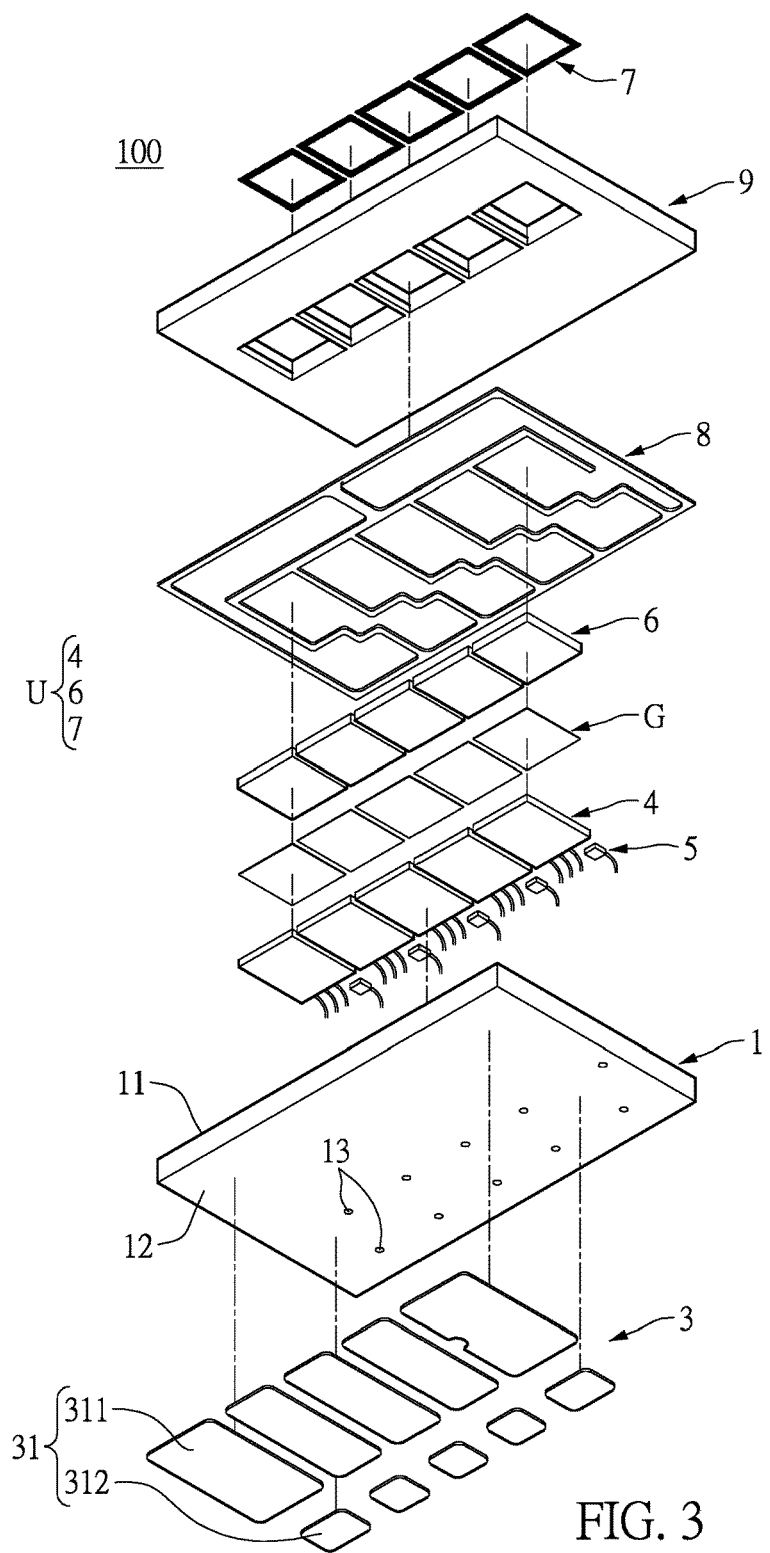
FIG. 3 is an exploded view of FIG. 1 from another perspective.

Reference is made to FIGS. 1 to 7, which illustrate a first embodiment of the present disclosure. As shown in FIGS. 1 to 3, the present embodiment discloses an LED package structure 100. The LED package structure 100 includes a substrate 1, an electrode layer 2, an insulating layer 8, a soldering layer 3, a plurality of LED chips 4, a plurality of Zener chips 5, a plurality of phosphor sheets 6, a plurality of light guiding groups 7, and a housing 9. The substrate 1, the electrode layer 2, the insulating layer 8, and the soldering layer 3 in the present embodiment are jointly defined as a carrier. The electrode layer 2 and the insulating layer 8 are disposed on one surface of the substrate 1, and the soldering layer 3 is disposed on the other surface of the substrate 1. The LED chips 4 and the Zener chips 5 are mounted on the carrier (i.e., the electrode layer 2 and the insulating layer 8). The phosphor sheets 6 respectively cover the LED chips 4. The light guiding groups 7 are respectively disposed on the phosphor sheets 6. The housing 9 is disposed on the carrier (i.e., the electrode layer 2 and the insulating layer 8), and the housing 9 covers the side surfaces of each LED chip 4 and the side surfaces 62 of each phosphor sheet 6.

It should be noted that each of the LED chips 4, the corresponding phosphor sheet 6, and the corresponding light guiding group 7 in the present embodiment are jointly defined as a light emitting unit U. In other words, the LED package structure 100 in the present embodiment includes a plurality of light emitting units U. Moreover, the light emitting unit U in the present embodiment is a chip-scale light emitting unit U, but the present disclosure is not limited thereto.

As shown in FIGS. 2 and 3, the substrate 1 has a first surface 11 and a second surface 12 opposite to the first surface 11. The substrate 1 includes a plurality of conductive pillars 13 embedded therein, and two opposite ends of each conductive pillar 13 are respectively exposed from the first surface 11 and the second surface 12.

Figure 4:
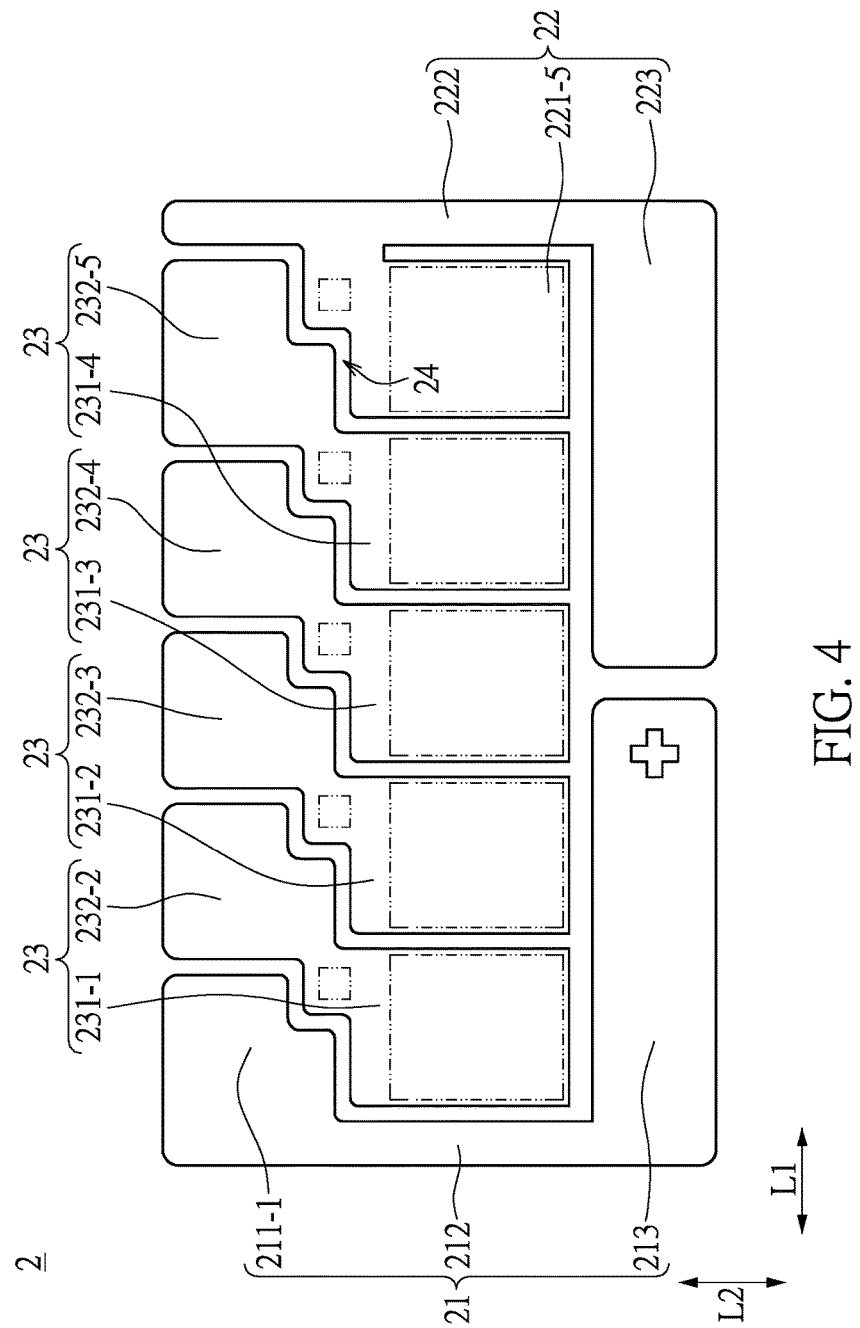
FIG. 4 is a planar view showing an electrode layer of the LED package structure.

As shown in FIGS. 2 and 4, the electrode layer 2 is disposed on the first surface 11 of the substrate 1. The electrode layer 2 includes a first metallic pad 21, a second metallic pad 22, and four third metallic pads 23. The four third metallic pads 23 are arranged between the first metallic pad 21 and the second metallic pad 22 in a first direction L1.

The first metallic pad 21 has an L-shaped first wiring portion 211-1 (which can also be referred to as a wiring portion 211), an elongated first extending portion 212, and a rectangular first electrode portion 213. Two opposite ends of the first extending portion 212 are respectively connected to the first wiring portion 211-1 and the first electrode portion 213. The second metallic pad 22 has an L-shaped fifth bonding portion 221-5, which can be taken as a bonding portion 221, an elongated second extending portion 222, and a rectangular second electrode portion 223. The second extending portion 222 is connected to the fifth bonding portion 221-5 and the second electrode portion 223. Each of the third metallic pads 23 has an L-shaped bonding portion 231 (i.e., a first bonding portion 231-1, a second bonding portion 231-2, a third bonding portion 231-3, or a fourth bonding portion 231-4) and an L-shaped wiring portion 232 (i.e., a second wiring portion 232-2, a third wiring portion 232-3, a fourth wiring portion 232-4, or a fifth wiring portion 232-5) integrally connected to the bonding portion 231. Each of the bonding portions 221-5, 231-1~231-4 is provided for mounting one of the LED chips 4 and one of the Zener chips 5. Each of the wiring portions 211-1, 232-2~232-5 is provided for one of the LED chips 4 and one of the Zener chips 5 to be wired.

Moreover, the first wiring portion 211-1 of the first metallic pad 21 and the second to fifth wiring portions 232-2~232-5 of the third metallic pads 23 are arranged in one row parallel to the first direction L1 and spaced apart from each other. The fifth bonding portion 221-5 of the second metallic pad 22 and the first to fourth bonding portions 231-1~231-4 of the third metallic pads 23 are arranged in another row parallel to the first direction L1 and spaced apart from each other. The bonding portions 231-1~231-4, 221-5 and the wiring portions 211-1, 232-2~232-5 are in a staggered arrangement.

In other words, the wiring portion 211 of the first metallic pad 21 in the present embodiment can be defined as the first wiring portion 211-1, and the other wiring portions 232 of the third metallic pads 23 in the present embodiment can be sequentially defined as the second wiring portion 232-2 arranged adjacent to the first wiring portion 211-1, the third wiring portion 232-3, the fourth wiring portion 232-4, and the fifth wiring portion 232-5. Moreover, one of the bonding portions 231 of the third metallic pad 23 in the present embodiment, which is arranged distant from the bonding portion 221 of the second metallic pad 22, can be defined as the first bonding portion 231-1, and the other bonding portions 231, 221 in the present embodiment can be sequentially defined as the second bonding portion 231-2, the third bonding portion 231-3, the fourth bonding portion 231-4, and the fifth bonding portion 221-5.

The first wiring portion 211-1 and the first bonding portion 231-1 are arranged in a second direction L2 perpendicular to the first direction L1, and a gap 24 having at least one bend is formed between the first wiring portion 211-1 and the first bonding portion 231-1. The second wiring portion 232-2 and the second bonding portion 231-2 are arranged in the second direction L2, and a gap 24 having at least one bend is formed between the second wiring portion 232-2 and the second bonding portion 231-2. The third wiring portion 232-3 and the third bonding portion 231-3 are arranged in the second direction L2, and a gap 24 having at least one bend is formed between the third wiring portion 232-3 and the third bonding portion 231-3. The fourth wiring portion 232-4 and the fourth bonding portion 231-4 are arranged in the second direction L2, and a gap 24 having at least one bend is formed between the fourth wiring portion 232-4 and the fourth bonding portion 231-4. The fifth wiring portion 232-5 and the fifth bonding portion 221-5 are arranged in the second direction L2, and a gap 24 having at least one bend is formed between the fifth wiring portion 232-5 and the fifth bonding portion 221-5. Specifically, each of the gaps 24 in the present embodiment has a W shape, but the present disclosure is not limited thereto.

The five LED chips 4 are respectively mounted on the first bonding portion 231-1, the second bonding portion 231-2, the third bonding portion 231-3, the fourth bonding portion 231-4, and the fifth bonding portion 221-5, and the five LED chips 4 are respectively and electrically connected to the first wiring portion 211-1, the second wiring portion 232-2, the third wiring portion 232-3, the fourth wiring portion 232-4, and the fifth wiring portion 232-5 by wiring. Moreover, the five Zener chips 5 are respectively mounted on the first bonding portion 231-1, the second bonding portion 231-2, the third bonding portion 231-3, the fourth bonding portion 231-4, and the fifth bonding portion 221-5, and the five Zener chips 5 are respectively and electrically connected to the first wiring portion 211-1, the second wiring portion 232-2, the third wiring portion 232-3, the fourth wiring portion 232-4, and the fifth wiring portion 232-5 by wiring.

It should be noted that each of the bonding portions 221, 231 or each of the wiring portions 211, 232 in the present embodiment can be regarded as a functional portion 221, 231, 211, 232. That is to say, the functional portions 221, 231, 211, 232 in the present embodiment are a plurality of bonding portions 221, 231 for respectively mounting the LED chips 4 and a plurality of wiring portions 211, 232 for respectively wiring the LED chips 4. In addition, the number of the third metallic pads 23 of the electrode layer 2 can be adjusted according to the number of the LED chips 4. For example, if the LED package structure 100 is provided with only one LED chip 4, the electrode layer 2 is provided without any third metallic pad 23. Specifically, the electrode layer 2 includes the first metallic pad 21 and the second metallic pad 22 arranged adjacent to the first metallic pad 21.

As shown in FIG. 2, the insulating layer 8 is disposed on the first surface 11 of the substrate 1. The insulating layer 8 is shape-complementary to and coplanar with the electrode layer 2. That is to say, the insulating layer 8 is disposed on a portion of the first surface 11 of the substrate 1 which is not connected to the electrode layer 2, and a side edge of the insulating layer 8 is flush with a side edge of the substrate 1.

The soldering layer 3 is disposed on the second surface 12 and is electrically connected to the electrode layer 2 and the LED chips 4. The soldering layer 3 includes a plurality of sets of soldering pads 31. The sets of the soldering pads 31 are respectively and electrically connected to the bonding portions 231, 221 and the wiring portions 211, 232 of the electrode layer 2 by using the conductive pillars 13 embedded in the substrate 1.

Specifically, each set of the soldering pads 31 includes a negative soldering pad 311 and a positive soldering pad 312. The negative soldering pads 311 of the soldering layer 3 are respectively arranged under the bonding portions 231, 221, and are respectively and electrically connected to the bonding portions 231, 221 by using the conductive pillars 13. The positive soldering pads 312 of the soldering layer 3 are respectively arranged under the wiring portions 211, 232, and are respectively and electrically connected to the wiring portions 211, 232 by using the conductive pillars 13.

Thus, the LED chips 4 can be electrically connected in series by the arrangement of the electrode layer 2. Each set of the soldering pads 31 of the soldering layer 3 is provided in an electrically independent arrangement, so that the corresponding LED chip 4 can be controlled independently through each set of the soldering pads 31. That is to say, each LED chip 4 can be independently controlled by using the corresponding set of the soldering pads 31 for being applied to an adaptive front lighting system (AFS).

Each LED chip 4 in the present embodiment is a vertical chip. The LED chips 4 are respectively mounted on the bonding portions 221, 231 of the electrode layer 2, and are respectively and electrically connected to the wiring portions 211, 232 of the electrode layer 2 by wiring. At least three side surfaces 42 of each of the LED chips 4 are flush with at least three edges of the corresponding bonding portion 221, 231.

The Zener chips 5 are respectively mounted on the bonding portions 221, 231 of the electrode layer 2, and are respectively and electrically connected to the wiring portions 211, 232 of the electrode layer 2 by wiring. The LED chip 4 and the Zener chip 5, which are mounted on the same bonding portion 211, 231, are arranged at two different locations, thereby preventing a bonding adhesive from overflowing.

It should be noted that the number of the LED chips 4, the number of the phosphor sheets 6, and the number of the light guiding groups 7 in the present embodiment are the same. The structure of each LED chip 4, the corresponding phosphor sheet 6, and the corresponding light guiding group 7 is substantially identical to the structure of the other LED chip 4, the corresponding phosphor sheet 6, and the corresponding light guiding group 7.

As shown in FIGS. 2, 5, 6A, and 6B, the phosphor sheet 6 in the present embodiment can be a phosphor-in-glass (PiG) or a phosphor-in-ceramic (PiC). The refractive index of the phosphor sheet 6 is substantially within the range of 1.5 to 1.85. The phosphor sheet 6 has a width-to-thickness ratio of 5:1 to 15:1. A top surface of the LED chip 4 is substantially covered by the phosphor sheet 6, and at least one side surface 62 of the phosphor 6 protrudes from the LED chip 4 for a distance D of 5 μm~10 μm.

Specifically, the phosphor sheet 6 in the present embodiment has at least three side surfaces 62, which respectively protrude from the three side surfaces of the LED chip 4 flush with the outer edge of the corresponding bonding portion 221, 231. The LED package structure 100 in the present embodiment preferably includes a transparent adhesive layer G for adhering the phosphor sheet 6 to the LED chip 4, but the present disclosure is not limited thereto.

The phosphor sheet 6 has a light emitting surface 61 arranged away from the LED chip 4. The light emitting surface 61 has a central region 611 and a ring-shaped region 612 surrounding the central region 611. The ring-shaped region 612 in the present embodiment is arranged between the central region 611 and an edge of the light emitting surface 61. The shape of the central region 611 can be changed according to practical needs, such as to be circular, square, or rectangular.

The light guiding group 7 has a refractive index substantially equal to the refractive index of the phosphor sheet 6. The light guiding group 7 in the present embodiment can be made of phosphor material, and the refractive index of the light guiding group 7 is substantially within a range of 1.5 to 1.85. If the light guiding group 7 and the phosphor sheet 6 are made of the same material, the light guiding group 7 can be integrally formed on the phosphor sheet 6 in one piece by molding. Naturally, the light guiding group 7 can also be first formed by molding, and then adheres the light guiding group 7 to the phosphor sheet 6.

Specifically, the light guiding group 7 is in a ring shape and includes a plurality of light guiding micro-structures 71. The light guiding micro-structures 71 are discretely distributed around the ring-shaped region 612 of the phosphor sheet 6, and the light guiding micro-structures 7 can be integrally formed on the ring-shaped region 612. Moreover, the light guiding micro-structures 71 in the present embodiment substantially have the same shape. For example, the plurality of light guiding micro-structures 71 are a plurality of hemispherical micro-structures (as shown in FIG. 6B) or a plurality of pyramidal micro-structures (as shown in FIG. 6C). As shown in FIG. 6B or FIG. 6C, the cross-section of each of the light guiding micro-structures 71 is gradually smaller in a direction away from the ring-shaped region 612. That is to say, each of light guiding micro-structures 71 has a broader lower portion and a narrower upper portion. Accordingly, the LED package structure 100 adapts the light guiding group 7, which has the refractive index substantially equal to the refractive index of the phosphor sheet 6, to be disposed on the ring-shaped region 612 of the phosphor sheet 6, so that the total reflection occurring on the ring-shaped region 612 can be reduced, thereby effectively improving the yellow ring problem with the LED package structure 100 of the present disclosure.

It should be noted that the light guiding micro-structures 71 of the light guiding group 7 and the corresponding light emitting surface 61 can be configured with a specific relationship to achieve better light uniformity and better light efficiency of the LED package structure 100. Specifically, if a width of the light emitting surface 61 is defined as $W_G$, a width of the ring-shaped region 612 is defined as $W_{MS}$, a distance between any two adjacent light guiding micro-structures 71 is defined as $P_{MS}$, and a height of each of the light guiding micro-structures 71 is defined as $H_{MS}$, the above parameters satisfy the formula: $W_G=XW_{MS}=ZP_{MS}$, $1<X\leq10$, $0<Z\leq1000$, and $P_{MS}=YH_{MS}$ and $1.5\leq Y\leq2.5$.

The housing 9 is disposed on the electrode layer 2 and the insulating layer 8. The housing 9 and the insulating layer 8 in the present embodiment are integrally formed as one piece, but the present disclosure is not limited thereto. The housing 9 surrounds and covers the side surfaces of each LED chip 4 and the side surfaces of each phosphor sheet 6, and the Zener chips 5 are embedded in the housing 9, thereby preventing the Zener chips 5 from blocking light generated from the LED chips 4. The housing 9 has a top surface 91 substantially flush with the light emitting surface 61 of each phosphor sheet 6. That is to say, a distance between the top surface 91 of the housing 9 and the substrate 1 is equal to a distance between the light emitting surface 61 of each phosphor 6 and the substrate 1.

Moreover, a portion of the housing 9 having an inverted T-shaped cross-section is defined as a spacer 92. The spacer 92 is configured to separate two adjacent LED chips 4 and is configured to separate two adjacent phosphor sheets 6, which are respectively disposed on the two adjacent LED chips 4. A portion of the spacer 92 arranged adjacent to the insulating layer 8 has a width larger than a width of a portion of the spacer 92 arranged away from the insulating layer 8.

In addition, although the LED package structure 100 in the present embodiment is shown as in FIGS. 1 to 6C, but it is not limited thereto. In other words, the design of the LED package structure 100 can be changed according to practical needs.

Figure 7:
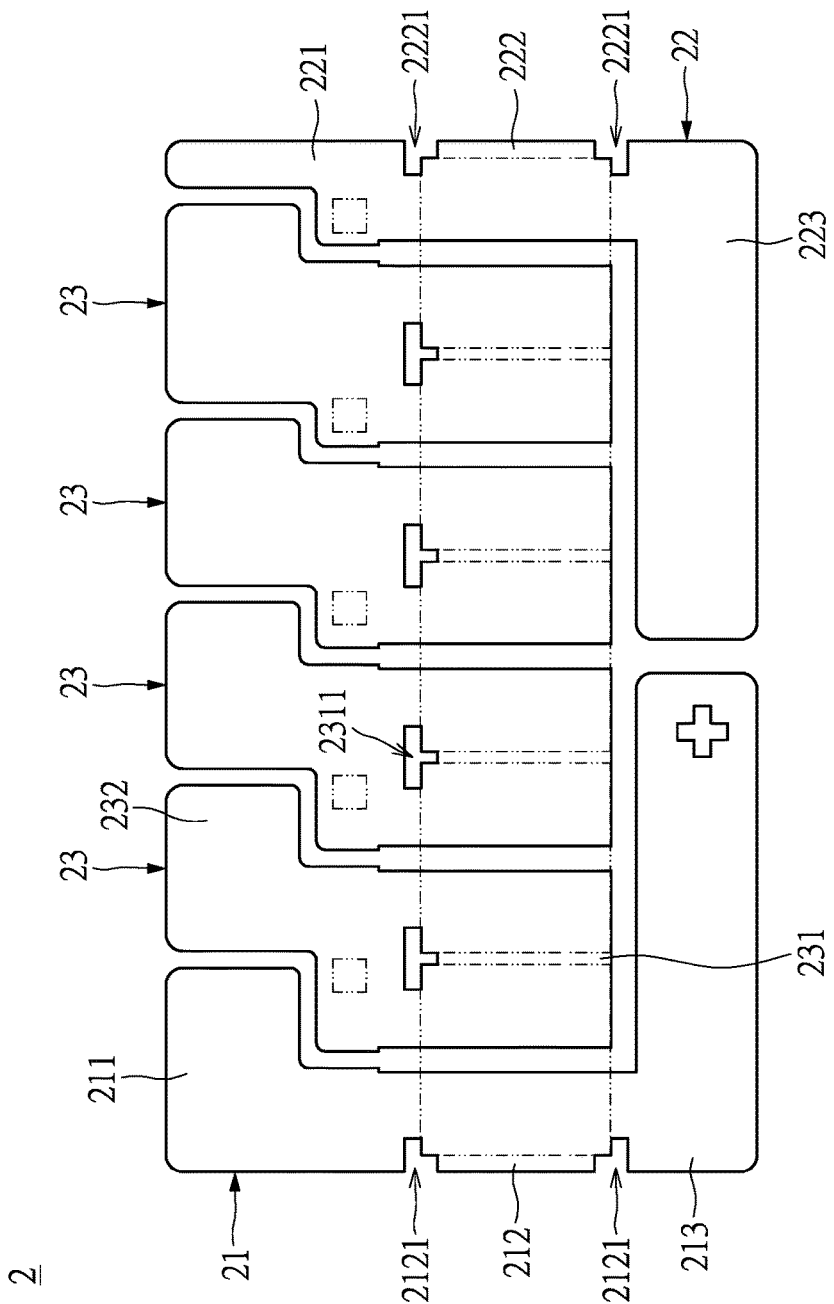
FIG. 7 is a planar view showing the electrode layer of the LED package structure in another configuration according to the first embodiment.

For example, the LED chip 4 of the LED package structure 100 can be a flip chip, and the structure of the electrode layer 2 can be adjusted to cooperate with the flip chip (as shown in FIG. 7). Specifically, the electrode layer 2 includes a first metallic pad 21, a second metallic pad 22, and four third metallic pads 23 arranged between the first metallic pad 21 and the second metallic pad 22. The first metallic pad 21 has an L-shaped functional portion 211, a rectangular first extending portion 212, and a rectangular first electrode portion 213. The second metallic pad 22 has an L-shaped functional portion 221, a rectangular second extending portion 222, and a rectangular second electrode portion 223. The two functional portions 211, 221 are provided for bonding or wiring. Each of the first extending portion 212 and the second extending portion 222 has two L-shaped slots 2121, 2221. The third metallic pads 23 each has a substantial S-shape, and the third metallic pads 23 are spaced apart from each other. An upper portion of each third metallic pad 23 is defined as a wiring portion 232 for wiring one of the Zener chips 5, and a lower portion of each third metallic pad 23 is defined as a bonding portion 231 for mounting one of the LED chips 4 and one of the Zener chips 5. The lower portion of each third metallic pad 23 further has a T-shaped slot 2311. It should be noted that each of the LED chips 4 in the present embodiment is disposed on and across two adjacent metallic pads 21, 22, 23. Specifically, the first LED chip 4 counted from the left side of FIG. 7 is disposed on the first metallic pad 21 and the adjacent third metallic pad 23. Each of the second, third, and fourth LED chips 4 is disposed on any two adjacent third metallic pads 23. The fifth LED chip 4 is disposed on the second metallic pad 22 and the adjacent third metallic pad 23. The L-shaped slots 2121, 2221 and the T-shaped slots 2311 are provided for positioning the LED chips 4.

Second Embodiment

Figure 8:
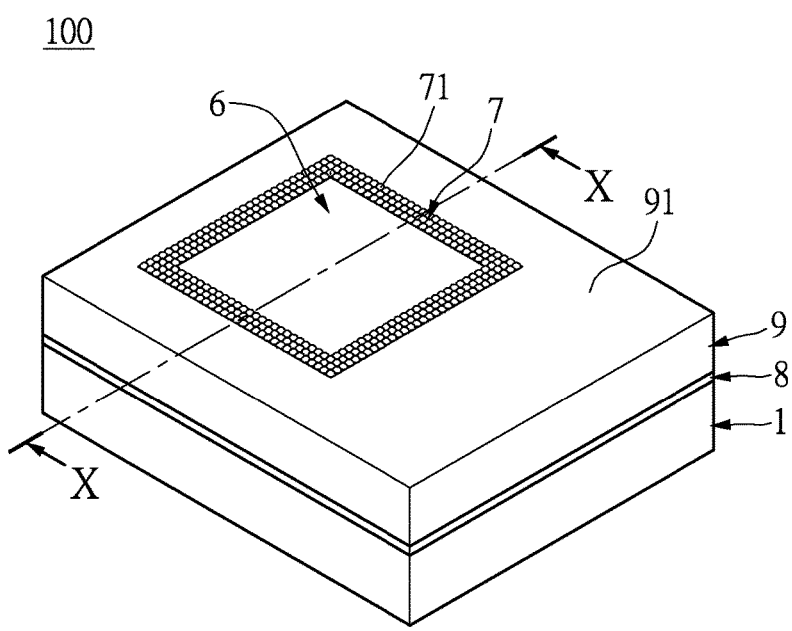
FIG. 8 is a perspective view showing the LED package structure according to a second embodiment of the present disclosure.
Figure 9:
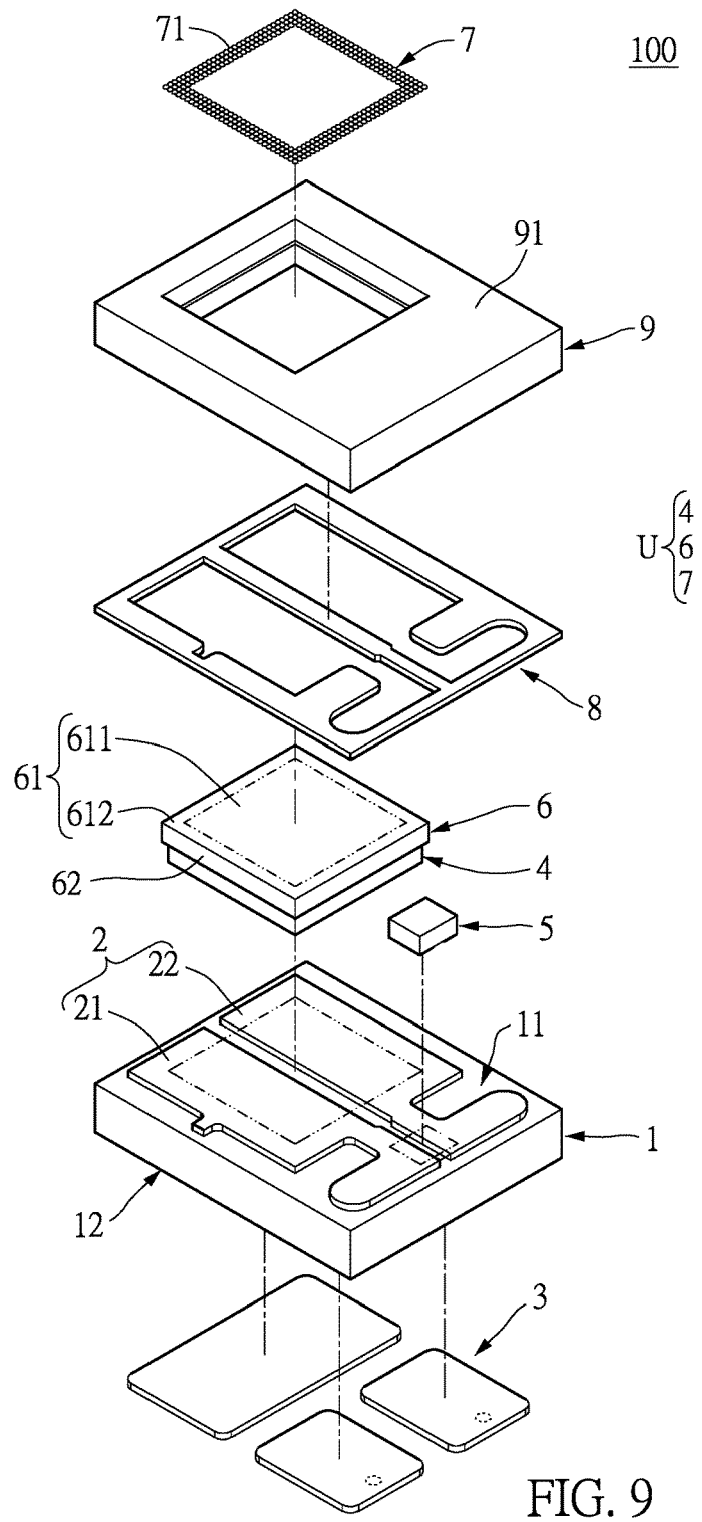
FIG. 9 is an exploded view of FIG. 8.
Figure 10:
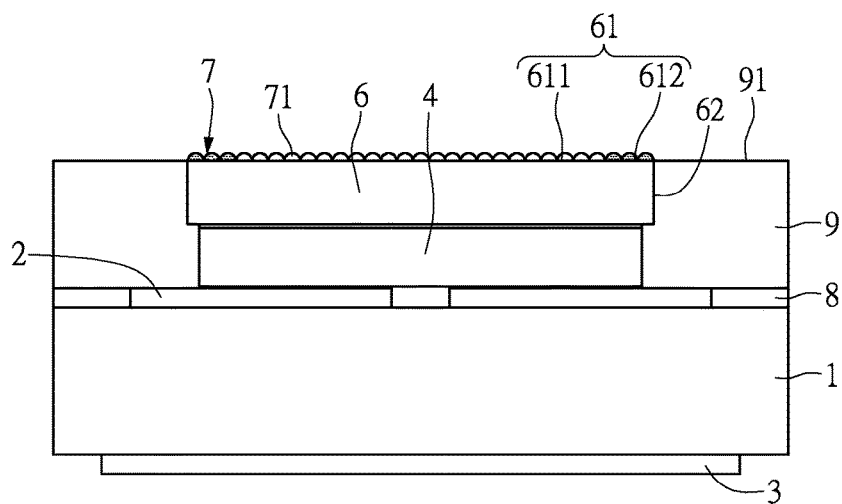
FIG. 10 is a cross-sectional view taken along a cross-sectional line X-X of FIG. 8.

Reference is made to FIGS. 8 to 10, which illustrate a second embodiment of the present disclosure. The difference between the second embodiment and the first embodiment is disclosed as follows. The number of the LED chips 4 of the LED package structure 100 in the second embodiment is only one, and other components of the LED package structure 100 can be adjusted according to the number of the LED chips 4.

Specifically, the LED package structure 100 includes a carrier, an LED chip 4, a Zener chip 5, a phosphor sheet 6, a ring-shaped light guiding group 7, and a housing 9, wherein the carrier includes a substrate 1, an electrode layer 2, an insulating layer 8, and an soldering layer 3. The electrode layer 2 and the insulating layer 8 are disposed on one surface of the substrate 1, and the soldering layer 3 is disposed on the other surface of the substrate 1. The LED chip 4 and the Zener chip 5 are mounted on the electrode layer 2 and the insulating layer 8. The phosphor sheet 6 covers the LED chip 4. The light guiding group 7 is disposed on the phosphor sheet 6. The housing 9 is disposed on the electrode layer 2 and the insulating layer 8, and the housing 9 covers the side surfaces of the LED chip 4 and the sides of the phosphor sheet 6.

It should be noted that each of the LED chip 4, the corresponding phosphor sheet 6, and the corresponding light guiding group 7 in the present embodiment are jointly defined as a light emitting unit U. In other words, the LED package structure 100 in the present embodiment includes one light emitting unit U. Moreover, the light emitting unit U in the present embodiment is a chip-scale light emitting unit U, but the present disclosure is not limited thereto.

The substrate 1 has a first surface 11 and a second surface 12 opposite to the first surface 11. The substrate 1 includes a plurality of conductive pillars (not labeled) embedded therein, and two opposite ends of each conductive pillar are respectively exposed from the first surface 11 and the second surface 12.

The electrode layer 2 is disposed on the first surface 11 of the substrate 1. The electrode layer 2 includes a first metallic pad 21 and a second metallic pad 22 that is separated from the first metallic pad 21. The insulating layer 8 is disposed on the first surface 11 of the substrate 1. The insulating layer 8 is shape-complementary to and coplanar with the electrode layer 2. That is to say, the insulating layer 8 is disposed on a portion of the first surface 11 of the substrate 1 which is not connected to the electrode layer 2, and a side edge of the insulating layer 8 is flush with a side edge of the substrate 1. The soldering layer 3 is disposed on the second surface 12 and is electrically connected to the electrode layer 2 and the LED chip 4 by using the conductive pillars.

The LED chip 4 and the Zener chip 5 are mounted on the electrode layer 2 and the insulating layer 8. The phosphor sheet 6 and the light guiding group 7 in the present embodiment are substantially identical to the first embodiment. The top surface of the LED chip 4 is covered entirely by the phosphor sheet 6. The light guiding group 7 is in a ring shape and includes a plurality of light guiding micro-structures 71, and the light guiding micro-structures 71 are discretely distributed around the ring-shaped region 612 of the phosphor sheet 6. Specifically, the light guiding group 7 covers at least 35%-45% of the area of the light emitting surface 61 of the phosphor sheet 6. In other words, at least 55%-65% of the area of the light emitting surface 61 of the phosphor sheet 6 is not covered by the light guiding group 7.

In the present embodiment, the color of the housing 9 can be white for enhancing light reflection or black for improving light resolution, but is not limited thereto. The housing 9 is disposed on the electrode. The housing 9 and the insulating layer 8 in the present embodiment are integrally formed as one-piece, but the present disclosure is not limited thereto. The housing 9 surrounds and covers the sides of each LED chip 4 and the sides of each phosphor sheet 6, and the Zener chips 5 are embedded in the housing 9. The housing 9 has a top surface 91 substantially flush with the light emitting surface 61 of the phosphor sheet 6. That is to say, a distance between the top surface 91 of the housing 9 and the substrate 1 is equal to a distance between the light emitting surface 61 of the phosphor 6 and the substrate 1.

Third Embodiment

Figure 11:
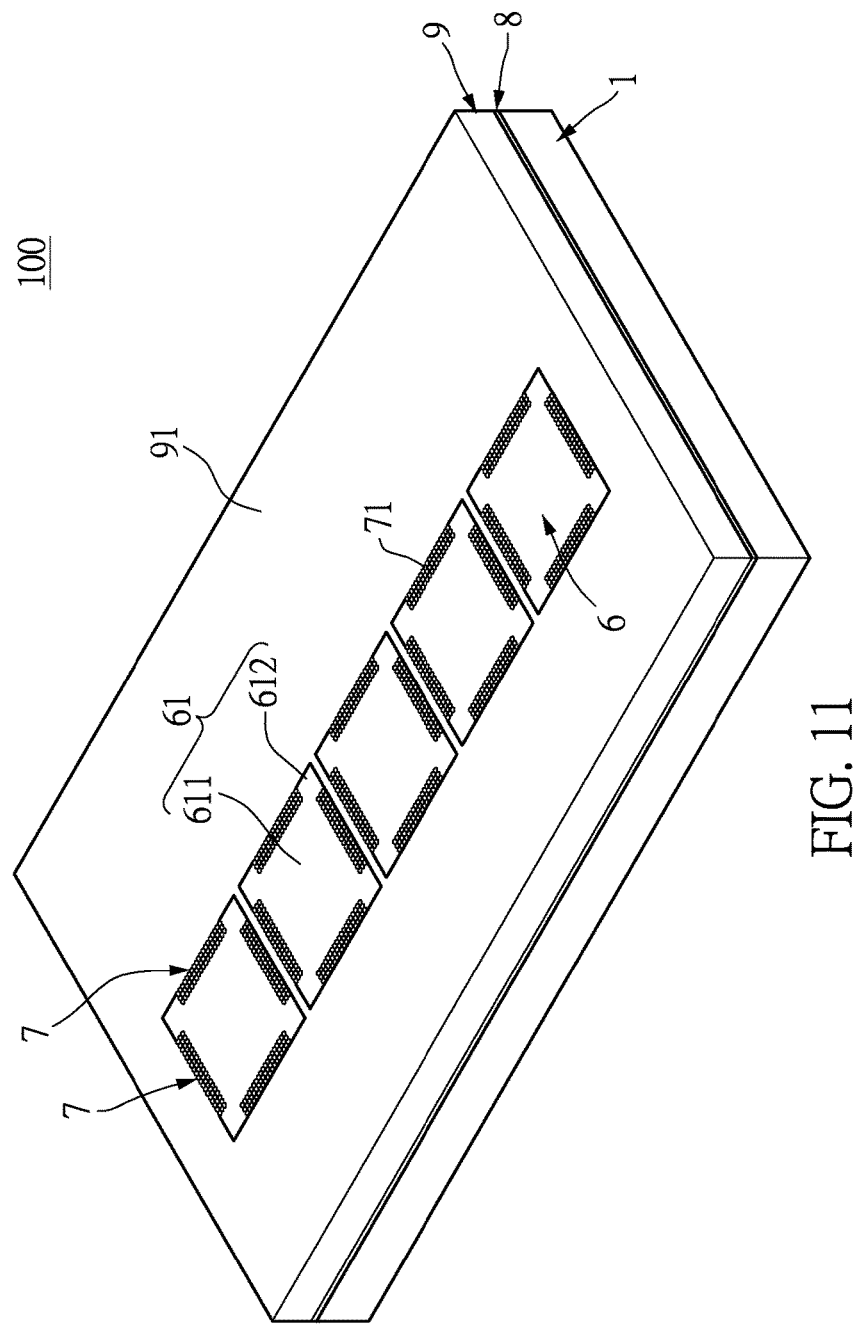
FIG. 11 is a perspective view showing the LED package structure according to a third embodiment of the present disclosure.
Figure 12:
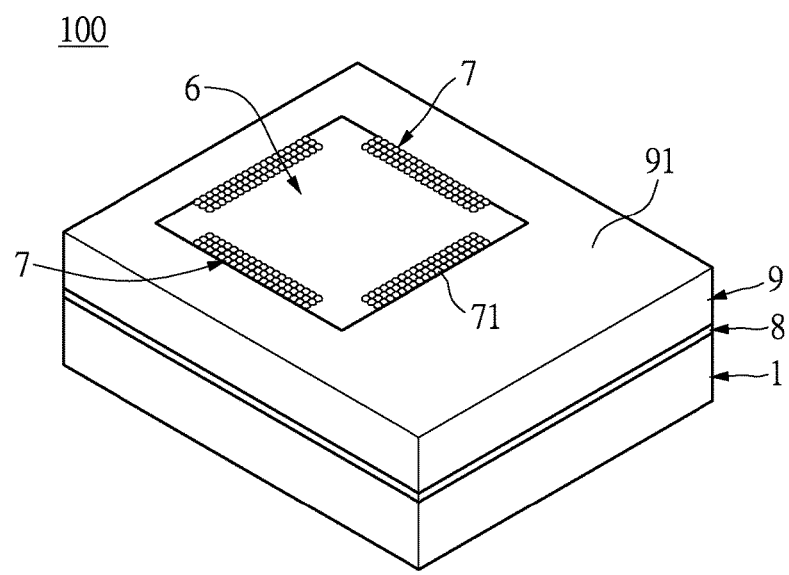
FIG. 12 is a perspective view showing the LED package structure in another configuration according to the third embodiment.

Reference is made to FIGS. 11 and 12, which illustrate a third embodiment of the present disclosure. The third embodiment is similar to the above first and second embodiments, and the differences between the third embodiment and the above two embodiments are disclosed as follows. The light emitting unit U in the present embodiment includes a plurality of light guiding groups 7 separately disposed on the ring-shaped region 612 of the phosphor sheet 6. Specifically, the light guiding groups 7 cover at least 60% of an area of the ring-shaped region 612 of the corresponding phosphor sheet 6, and do not cover the central region 611 of the corresponding phosphor sheet 6. Specifically, in each light emitting unit U, the light guiding groups 7 covers at least 21%-27% of the area of the light emitting surface 61 of the phosphor sheet 6. In other words, at least 73%-79% of the area of the light emitting surface 61 of the phosphor sheet 6 is not covered by the light guiding group 7.

Moreover, the number of the LED chips 4 of the LED package structure 100 in the present embodiment can be more than one (as shown in FIG. 11) or only one (as shown in FIG. 12), and other components of the LED package structure 100 can be adjusted according to the number of the LED chips 4.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An LED package structure, comprising:
   a carrier;
   at least one light emitting unit including:
      an LED chip mounted on the carrier;
      a phosphor sheet covering entirely a top surface of the LED chip, wherein the phosphor sheet has a light emitting surface arranged away from the LED chip, and the light emitting surface of the phosphor sheet has a central region and a ring-shaped region surrounding the central region; and
      at least one light guiding group disposed on the ring-shaped region and covering at least 60% of an area of the ring-shaped region of the phosphor sheet, the central region not being covered by the at least one light guiding group, wherein the at least one light guiding group includes a plurality of light guiding micro-structures; and
   a housing disposed on the carrier and covering side surfaces of the LED chip and side surfaces of the phosphor sheet of the at least one light emitting unit.

2. The LED package structure as claimed in claim 1, wherein the at least one light emitting unit includes a plurality of light guiding groups separately disposed on the ring-shaped region of the phosphor sheet.

3. The LED package structure as claimed in claim 1, wherein the plurality of light guiding micro-structures are discretely distributed around the ring-shaped region of the phosphor sheet.

4. The LED package structure as claimed in claim 1, wherein a top surface of the housing is substantially flush with the light emitting surface of the phosphor sheet.

5. The LED package structure as claimed in claim 1, wherein the at least one light emitting unit's number is more than one, and each of the light emitting units includes a plurality of light guiding groups being separately disposed on the ring-shaped region of the phosphor sheet.

6. The LED package structure as claimed in claim 1, wherein the LED package structure further comprises a plurality of light emitting units, the plurality of light guiding micro-structures of the at least one light guiding group entirely cover the ring-shaped region of the phosphor sheet and are distributed around the ring-shaped region of the phosphor sheet in corresponding one of the plurality of light emitting units.

7. The LED package structure as claimed in claim 1, wherein the phosphor sheet has a width-to-thickness ratio within a range of 5:1 to 15:1.

8. The LED package structure as claimed in claim 1, wherein the carrier includes:
   a substrate having a first surface and a second surface opposite to the first surface;
   an electrode layer disposed on the first surface of the substrate;
   an insulating layer disposed on the first surface of the substrate, wherein the insulating layer is shape-complementary to and coplanar with the electrode layer; and
   a soldering layer disposed on the second surface of the substrate and electrically connected to the electrode layer and the LED chip of the at least one light emitting unit,
   wherein the LED chip is mounted on the electrode layer and the insulating layer, and the housing is disposed on the electrode layer and the insulating layer.

9. The LED package structure as claimed in claim 1, wherein a width of the light emitting surface of the phosphor sheet is defined as $W_G$, and a width of the ring-shaped region of the light emitting surface is defined as $W_{MS}$, wherein $W_G = X W_{MS}$ and $1 < X \leq 10$.

10. The LED package structure as claimed in claim 1, wherein a distance between any two adjacent light guiding micro-structures is defined as $P_{MS}$, and a height of each of the light guiding micro-structures is defined as $H_{MS}$, wherein $P_{MS} = Y H_{MS}$ and $1.5 \leq Y \leq 2.5$.

11. The LED package structure as claimed in claim 1, wherein a width of the light emitting surface is defined as $W_G$, a width of the ring-shaped region of the light emitting surface is defined as $W_{MS}$, and a distance between any two adjacent light guiding micro-structures is defined as $P_{MS}$, wherein $W_G = X W_{MS} = Z P_{MS}$, $1 < X \leq 10$, and $0 < Z \leq 1000$.

12. The LED package structure as claimed in claim 1, wherein a refractive index of the at least one light guiding group is substantially equal to a refractive index of the phosphor sheet, and the refractive index of the at least one light guiding group is substantially within a range of 1.5 to 1.85.

13. A chip-scale light emitting unit, comprising:
   an LED chip;
   a phosphor sheet covering entirely a top surface of the LED chip, wherein the phosphor sheet has a light emitting surface arranged away from the LED chip, and the light emitting surface of the phosphor sheet has a central region and a ring-shaped region surrounding the central region; and
   at least one light guiding group disposed on the ring-shaped region and covering at least 60% of an area of the ring-shaped region of the phosphor sheet, the central region not being covered by the at least one light guiding group, wherein the at least one light guiding group includes a plurality of light guiding micro-structures.

14. The chip-scale light emitting unit as claimed in claim 13, wherein a refractive index of the at least one light guiding group is substantially equal to a refractive index of the phosphor sheet, wherein the plurality of light guiding micro-structures are a plurality of hemispherical micro-structures or a plurality of pyramidal micro-structures.

15. The chip-scale light emitting unit as claimed in claim 13, further comprising a plurality of light guiding groups separately disposed on the ring-shaped region of the phosphor sheet.

16. The chip-scale light emitting unit as claimed in claim 13, wherein the plurality of light guiding micro-structures are discretely distributed around the ring-shaped region of the phosphor sheet.

17. The chip-scale light emitting unit as claimed in claim 13, wherein a width of the light emitting surface of the phosphor sheet is defined as $W_G$, and a width of the ring-shaped region of the light emitting surface is defined as $W_{MS}$, wherein $W_G = X W_{MS}$ and $1 < X \le 10$.

18. The chip-scale light emitting unit as claimed in claim 13, wherein a distance between any two adjacent light guiding micro-structures is defined as $P_{MS}$, and a height of each of the light guiding micro-structures is defined as $H_{MS}$, wherein $P_{MS} = Y H_{MS}$ and $1.5 \le Y \le 2.5$.

19. The chip-scale light emitting unit as claimed in claim 13, wherein a width of the light emitting surface is defined as $W_G$, a width of the ring-shaped region of the light emitting surface is defined as $W_{MS}$, and a distance between any two adjacent light guiding micro-structures is defined as $P_{MS}$, wherein $W_G = X W_{MS} = Z P_{MS}$, $1 < X \le 10$, and $0 < Z \le 1000$.

20. The chip-scale light emitting unit as claimed in claim 13, wherein the phosphor sheet has a width-to-thickness ratio within a range of 5:1 to 15:1, and a refractive index of the phosphor sheet is substantially within a range of 1.5 to 1.85.

* * * * *